United States Patent
Bell et al.

(10) Patent No.: US 6,445,578 B1
(45) Date of Patent: Sep. 3, 2002

(54) DATA STORAGE ENCLOSURE

(75) Inventors: Michael Stephen Bell, Penrose; Grant Edward Carlson, Florissant, both of CO (US)

(73) Assignee: Eurologic Systems, Dublin (IE)

( * ) Notice: Subject to any disclaimer, the term of this patent is extended or adjusted under 35 U.S.C. 154(b) by 77 days.

(21) Appl. No.: 09/650,810

(22) Filed: Aug. 30, 2000

Related U.S. Application Data

(60) Provisional application No. 60/213,412, filed on Jun. 22, 2000.

(51) Int. Cl.⁷ .................................................. H05K 5/02
(52) U.S. Cl. ...................... 361/685; 361/683; 361/724; 361/727; 361/807; 361/805; 312/223.1; 312/223.6
(58) Field of Search ................................ 361/685, 684, 361/683, 724, 725, 726, 727, 807, 809; 312/223.1, 223.2, 223.6; 211/26

(56) References Cited

U.S. PATENT DOCUMENTS

| | | | | |
|---|---|---|---|---|
| 4,130,922 A | * | 12/1978 | Koett | ...................... 29/243.53 |
| 5,590,938 A | * | 1/1997 | De Andrea | ............... 312/257.1 |
| 5,969,913 A | * | 10/1999 | Vanderheyden et al. | .... 360/132 |
| 6,028,769 A | * | 2/2000 | Zurek | .......................... 361/704 |
| 6,209,842 B1 | * | 4/2001 | Anderson et al. | ........... 248/560 |
| 6,288,902 B1 | * | 9/2001 | Kim et al. | ................... 361/725 |
| 6,317,334 B1 | * | 11/2001 | Abruzzini et al. | .......... 361/797 |

* cited by examiner

Primary Examiner—Darren Schuberg
Assistant Examiner—David Foster
(74) Attorney, Agent, or Firm—Oppedahl & Larson LLP

(57) ABSTRACT

An enclosure for a data storage system comprises at least first and second cast magnesium parts joined by rivets, each of which is made of a suitable material that provides compressive strength superior to that of the cast magnesium. Each rivet is of a height or thickness equal to the sum of the thickness of the parts to be riveted. Each such rivet has flat end surfaces and its body is peripherally concave between its ends. The rivet is embedded in the two parts, and the parts flow radially against the concave body of the rivet. No drilling is required, and the parts are held in carefully defined position while being joined, so that the assembled enclosure satisfies strict dimensional tolerances.

2 Claims, 2 Drawing Sheets

Figure 1
Figure 2
Figure 3
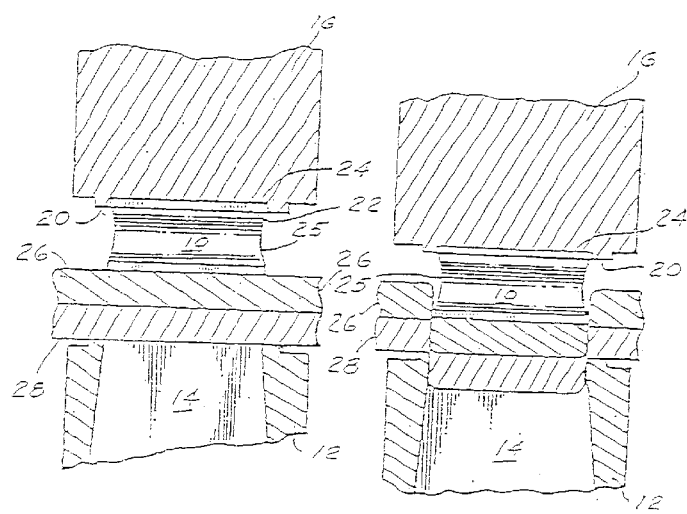
Figure 4
Figure 5
Figure 6
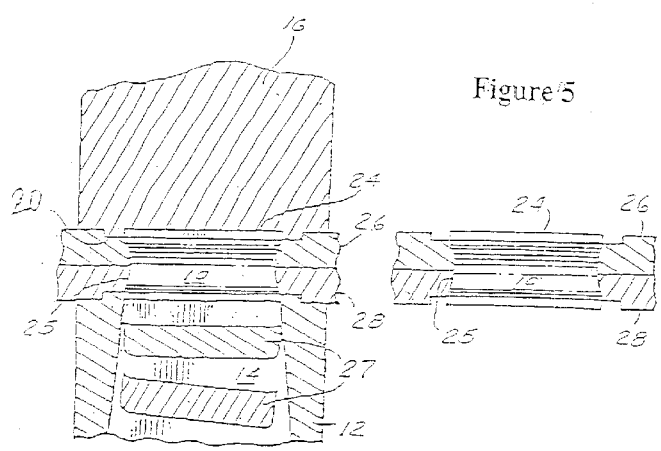
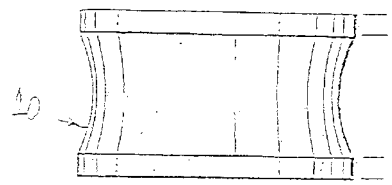
Figure 7
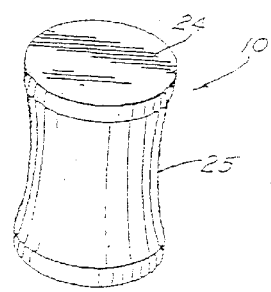

DATA STORAGE ENCLOSURE

This application claims priority from U.S. application Ser. No. 60/213,412 filed Jun. 22, 2000, which is hereby incorporated herein by reference to the extent permitted by law.

The application relates generally to data storage enclosures, and relates more particularly to improved data storage enclosures made of cast magnesium or other non-ferrous material and held together with rivets.

BACKGROUND

There are many constraints on the mechanical design and manufacture of an enclosure for a data storage system. The enclosure must be strong. It needs to have myriad features to accomplish many design requirements, including guideways for receiving disk drive carriers and other devices. It should not cost too much to manufacture and should not be too heavy. Yet it must be constructed to rather close dimensional tolerances so that each piece aligns properly with its neighbors.

Most computer data storage systems are traditionally rack-mounted in industry-standard nineteen-inch racks. Each system is thus of a width to fit in the rack, and is of a height to accommodate the height of a disk drive. A plurality of disk drives are mounted in the system, parallel to each other and stacked to reach nearly the width of the rack.

Historically, computer data storage enclosures have been made of formed and fastened steel sheet metal. Such enclosures are composed of numerous discrete parts that require accurate manufacturing and assembly techniques in order to insure proper fit, form, and function. If this level of precision is not met an assortment of problems can result. These maladies can range from an enclosure's inability to contain Electro-magnetic emissions to the generation of hard and soft errors from rotational vibration between adjacent disk drives. In addition to maintaining control over the structural aspects of the enclosure, it is also important to keep the drives and power supplies from overheating, so system cooling is paramount. Such cooling can be accomplished by a combination of forced-air cooling and inter-material conduction. The bulk material of a steel sheet metal enclosure often contributes little to cooling, and in fact may impede cooling. It is additionally necessary to provide plenums or other air guides so that cooling air from the system's internal blowers can pass over each of the disk drives. It would be unacceptable for any disk drive to be starved of cooling air.

It is necessary to provide guideways which permit sliding disk drives into the enclosure. The guideways must satisfy many requirements, for example, they must cause the disk drive's connectors to align with corresponding connectors on a backplane inside the enclosure. The guideways must also be spaced and shaped to within particular tolerances simply to receive the disk drives. The guideways must provide locking mechanisms to lock disk drives into place, yet must permit a drive to be readily unlocked for removal.

Typically, a sheet metal enclosure is relatively expensive to fabricate, especially considering the very demanding requirements for guideways and air plenums. Even with the use of thin gage sheet metals these enclosures are traditionally heavy which make them hard to handle and ultimately expensive to ship. There is thus a great need for an enclosure for a disk storage system that keeps its shape well, that provides guideways for disk drives, that allows for easy provision of air plenums, that helps rather than hinders cooling, that doesn't weigh as much, and that can be economically manufactured.

One approach to this need is to use an enclosure made of cast magnesium or other non-ferrous parts. Two cast magnesium parts can be designed which, when combined, form an enclosure which substantially fulfills the needs just discussed. The further difficulty, then, is to devise a way of fastening the two parts. If sheet metal parts were used, it would be possible to employ any of a variety of fastening techniques, including spot welds, self-tapping sheet metal screws, machine screws and captive nuts, or rivets. But where cast magnesium parts are used, there are concerns about brittleness of the cast parts. Many cast metals do not weld well. Many combinations of screws and nuts present galvanic problems due to juxtaposition of dissimilar metals. More importantly, any fastening technique that requires driling of holes presents the further problem that it is necessary to worry about whether the holes have been drilled in the right place. This makes screws and nuts disfavored, and likewise disfavors nearly all riveting techniques that call for predrilled holes.

One commercially successful riveting system is that disclosed in U.S. Pat. No. 4,130,922 to Koett. This patent describes a headless riveting system in which a headless rivet is made from steel or a suitable material that provides compressive strength superior to that of the materials to be riveted together and of a height or thickness equal to the sum of the materials to be riveted. In this system, the rivet has flat or concave end surfaces and its body is peripherally concave between its ends. A die and punch are used to drive the rivet through the materials to be fastened. The rivet pierces the materials, comes to rest embedded in the materials, and the materials flow radially against the concave body of the rivet. The patent teaches, however, only that the materials are sheet materials, for example sheet steel or sheet aluminum. There is no mention in the patent that materials other than sheet materials can be joined with such rivets. Indeed, as a general matter the possible brittleness of a cast magnesium material would prompt one skilled in the art to rule out the use of self-piercing rivets as distinguished from rivets that are inserted into pre-drilled holes.

There is thus a great need for a fastening technique that works well with cast magnesium parts to permit fabrication of a high-quality enclosure for a data storage system. Stated differently, there is a great need for a high-quality enclosure for a data storage system, composed of cast magnesium parts that are reliably fastened together in compliance with exacting tolerances.

SUMMARY OF THE INVENTION

An enclosure for a data storage system comprises at least first and second cast non-ferrous parts such as magnesium parts joined by rivets, each of which is made of a suitable material that provides compressive strength superior to that of the cast metal. Each rivet is of a height or thickness equal to the sum of the thickness of the parts to be riveted. Each such rivet has flat end surfaces and its body is peripherally concave between its ends. The rivet is embedded in the two parts, and the parts flow radially against the concave body of the rivet. No drilling is required, and the parts are held in carefully defined position while being joined, so that the assembled enclosure satisfies strict dimensional tolerances.

DESCRIPTION OF THE DRAWING

The invention is described with respect to a drawing in several figures, of which FIG. 1 is an exploded view showing first and second dies and a rivet of the type employed in the enclosure according to the invention, FIG. 2 is a view showing the elements of FIG. 1 as positioned at the start of a riveting operation;

FIG. 3 is a view showing the relation of the dies and rivet with the rivet driven about halfway through the cast magnesium parts of the enclosure;

FIG. 4 is a view showing the relation of the dies and rivet at the completion of the riveting operation, FIG. 5 is a sectional view illustrating the finished riveted work and showing the manner in which the rivet is locked in place;

FIG. 6 is a side view of a rivet of the type used in assembly of an enclosure according to the invention;

FIG. 7 is a perspective view showing a rivet of round or cylindrical shape

Where possible, like elements are denoted with like reference designations.

DESCRIPTION OF THE INVENTION

Figure 8:
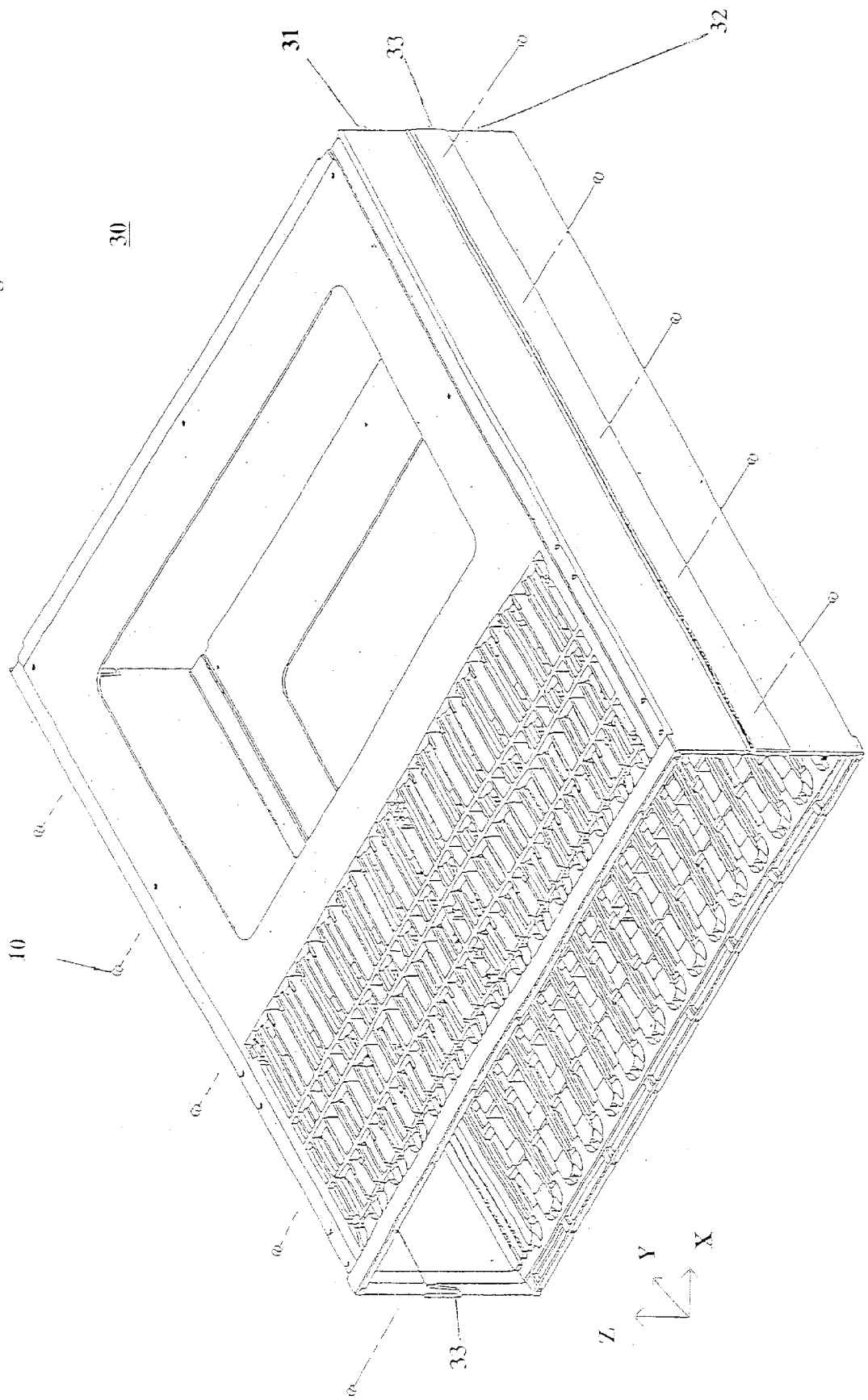
FIG. 8 is a perspective view of an enclosure according to the invention, showing two parts and showing rivets used to join the parts.

Turning first to FIG. 8, what is shown is a perspective view of an enclosure 30 according to the invention, showing two magnesium parts 31, 32 and showing rivets 10 used to join the parts. Long flat flanged regions 33 are formed in the parts 31, 32. These flanged regions 33 are shaped to mate cleanly, and are preferably quite flat. In the x-y-z coordinate system shown in FIG. 8, the flanged regions are preferably parallel to the y-z plane. This permits careful and ready positioning of the parts 31, 32 before doing any riveting, in both the y and z directions.

The riveting process will now be described in some detail. FIG. 1 shows a headless rivet 10 of generally cylindrical shape such as shown in FIG. 7, a die 12 having a passage 14 therethrough, the side walls of which are slightly diverging in the downward direction, and a punch 16 having its rivet engaging end 18 formed with staking lugs 20 which outline the area 22 against which the upper end 24 of the rivet 10 seats when the rivet is being driven.

As shown in FIG. 1, the die 12 is formed with a raised cutting ridge 30 which surrounds the opening 14 and serves the dual function of providing a shearing edge for the slugs to be punched out of the cast magnesium pieces to be fastened together when the rivet 10 is driven by the punch 16, and of providing staking means for engaging the margins of the punched opening through the lower member 28 of the work material.

The passage or opening 14 through the die member 12 is of the same cross-sectioned shape and size as is the piercing end of the rivet 12, the said opening or passage being larger only to provide shearing clearance for the lugs 27 struck from the work material as they fall through the die opening. (See FIG. 4.) The height of the cutting ridge 30 is preferably about 0.01 to 0.02 inch and, of course, the inner peripheral edge is more or less square to provide for a shearing function.

The punch 16 is preferably made of steel and is designed to drive the rivet 10 through the materials 26, 28 to be fastened together. This punch member 16 has a flat or convex area 22 for engaging the upper end of the rivet and a plurality of raised staking lugs 20 are provided to surround the said rivet engaging area at the edges thereof.

As shown in FIG. 2, the flat or concave upper end 24 of the rivet 10 fits snugly between the staking lugs 20 and in operation the punch, rivet and die are axially aligned. The height of the staking lugs 20 is preferably about the same as that of the die ridge 30.

The rivet 10 may be made of any suitable material, such as steel, having a compressive strength greater than that of the cast magnesium parts. This rivet 10 may also be of any desired cross-section, but is preferably generally cylindrical. The height or axial length of the rivet 10 must be substantially equal to the sum of the thickness of the cast magnesium pieces to be fastened together. Preferably the body or shank of the rivet 10 is slightly reduced between its ends, as along a shallow curve which forms a concavity 25 extending between the ends of the rivet, and the ends of the rivet are flat to conform with the top and bottom surfaces of the work, i.e. the pieces 26 and 28. The end-to-end concavity of the body is preferably formed by a radius having a length substantially equal to the length or height of the rivet, or at least sufficient to afford a positive lock between the rivet and the pierced material, as will be described.

The material for the rivets may be cold rolled steel case hardened 0.008–0.010, or LC CRS with carbonitride heat treat 0.008–0.010 treated with a Zinc surface coating for corrosion protection. Remarkably, despite being pressed into the cast material, the rivet's corrosion coating remains in place over most of the surface of the rivet.

For assembly of the cast magnesium parts, the material to be riveted (the flanges 31, 32) is placed between the axially aligned punch and die elements of the riveting mechanism, which may be of conventional design, and the rivet 10 is positioned between the punch 16 and the work so as to seat between the staking ribs or ridges 20 at the driving end of the punch, as shown in FIG. 2. The punch 16 then drives the rivet 10 through the work shearing out the slugs 27 and simultaneously coining the margins of the work to cause the work material to flow radially inward to tightly embrace the concave or reduced shank or body of the rivet and permanently lock the rivet into the work, with the ends of the rivet flush with the top and bottom surfaces of the work, as shown by FIGS. 4 and 5.

This assembly technique offers many advantages. First, the rivet is double-flush mounted in the work, or stated differently, it is nearly flush to the surface of the work on both faces.

Second, the self-piercing action of the rivet requires no alignment with preformed openings or other pre-working of the materials to be riveted together, for example, there is no need to pre-drill holes and thus there is no worry that the holes might be inadvertently drilled in the wrong places.

Turing again to FIG. 8, the relative positioning of the parts 31, 32 in the z direction is extremely important, because drive carriers will be inserted into guideways between the two parts 31, 32, sliding in the y direction until they are seated fully. If the parts 31, 32 are too far apart in the z direction, then RF shielding won't work properly around the edges of the drive carriers. If the parts 31, 32 are too close together in the z direction, then the drive carriers won't fit into their guideways. During assembly, a jig is used to position the parts 31, 32 in precisely the desired spacing, and the parts are tightly clamped together. Then the rivets 10 are driven into the work. Because there are no pre-drilled holes for the rivets 10, there is not much to go wrong as the rivets 10 are driven into the work, Importantly, it also is not critical exactly where on the flanges 31, 32 the rivets are inserted, so long as they are inserted more or less roughly in the correct places.

Those skilled in the art will have no difficulty devising myriad obvious improvements and variations, all of which are intended to fall within the scope of the invention as defined by the claims that follow. For example, although the invention is described in connection with a preferred material of magnesium, those skilled in the art will appreciate that other non-ferrous cast materials could be used just as well in the riveted structure.

What is claimed is:

1. An enclosure for a data storage system, the enclosure comprising first and second cast non-ferrous parts, said non-ferrous part composed of a magnesium alloy, said first and second cast non-ferrous parts fastened together at flange regions by a plurality of rivets, each of the rivets of a length substantially equal to the sum of the thickness of the flange regions, each of the rivets having flat or concave ends, said flat or concave ends substantially parallel to the flange regions, each of the rivets reduced slightly in width between its ends.

2. The enclosure of claim 1 wherein the rivets are substantially steel.

* * * * *